United States Patent
Hamada

(10) Patent No.: US 6,232,713 B1
(45) Date of Patent: May 15, 2001

(54) ORGANIC ELECTROLUMINESCENT APPARATUS AND METHOD OF FABRICATING THE SAME

(75) Inventor: Yuji Hamada, Nara-ken (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/211,041

(22) Filed: Dec. 15, 1998

(30) Foreign Application Priority Data

Dec. 17, 1997 (JP) .................................................... 9-347656

(51) Int. Cl.$^7$ ...................................................... H01J 1/62
(52) U.S. Cl. ........................... 313/498; 313/500; 313/506
(58) Field of Search .................................... 313/498, 500, 313/503, 504, 505, 506, 509

(56) References Cited

U.S. PATENT DOCUMENTS 5,742,129    4/1998  Nagayama et al. .................. 315/167

FOREIGN PATENT DOCUMENTS

| 196 03 451 A1 | 8/1996 | (DE) . |
|---|---|---|
| 0 553 496 A2 | 8/1993 | (EP) . |
| 0 732 868 A1 | 9/1996 | (EP) . |
| 0 767 599 A2 | 4/1997 | (EP) . |
| 8-227276 | 9/1996 | (JP) . |
| 8-315981 | 11/1996 | (JP) . |
| 9-102393 | 4/1997 | (JP) . |

OTHER PUBLICATIONS

Applied Physics Letters—vol. 71, No. 22, 1997—pp. 3197–3199.

"Nature"—vol. 347, 1990, pp. 539–541.

IDW'97 Proceedings of the Fourth International Display Workshops, 1997, pp. 581–584.

*Primary Examiner*—Vip Patel
(74) *Attorney, Agent, or Firm*—Armstrong, Westerman, Hattori, McLeland & Naughton, LLP

(57) ABSTRACT

In an organic electroluminescent apparatus according to the present invention, in arranging organic electroluminescent devices each having an organic layer having luminescent properties provided between a first electrode and a second electrode in a separated state, and a barrier having electrical insulating properties with a predetermined pattern is provided on the organic layer, to separate the organic electroluminescent devices from each other by the barrier.

5 Claims, 4 Drawing Sheets

ORGANIC ELECTROLUMINESCENT APPARATUS AND METHOD OF FABRICATING THE SAME

BACKGROUND OF THE INVENTION

1. Field of the Invention

The present invention relates generally to an organic electroluminescent apparatus having a plurality of organic electroluminescent devices each having an organic layer having luminescent properties provided between a hole injection electrode and an electron injection electrode in a separated state and a method of fabricating the same, which is characterized in that the plurality organic electroluminescent devices each having the organic layer having luminescent properties provided between the hole injection electrode and the electron injection electrode are simply and suitably arranged in a separated state, and particularly the plurality of organic electroluminescent devices can be suitably separated from each other even when the organic layer having luminescent properties contains a macromolecular material.

2. Description of the Related Art

In recent years, the needs of flat panel display devices the consumed power and the size of which are smaller than those of a CRT (cathode-ray Tube) which has been heretofore generally employed have been increased as information equipments are diversified, for example. An electroluminescent device has been paid attention to as one of the flat panel display devices.

The electroluminescent device is roughly divided into an inorganic electroluminescent device and an organic electroluminescent device depending on a used material.

The inorganic electroluminescent device is so adapted that a high electric field is generally exerted on a luminance portion, and electrons are accelerated within the high electric field to collide with a luminescence center, whereby the luminescence center is excited to emit light.

On the other hand, the organic electroluminescent device is so adapted that electrons and holes are respectively injected into a luminescent portion from an electron injection electrode and a hole injection electrode, the electrons and the holes thus injected are recombined with each other in a luminescence center to bring an organic molecule into its excited state, and the organic molecule emits fluorescence when it is returned from the excited state to its ground state.

In the case of the inorganic electroluminescent device, a high voltage of 100 to 200 volts is required as its driving voltage because a high electric field is exerted as described above. On the other hand, the organic electroluminescent derive can be driven at a low voltage of approximately 5 to 20 volts.

In the case of the organic electroluminescent device, a light emitting device emitting light in a suitable color can be obtained by selecting a fluorescent material that is a luminescent material. It is expected that the organic electroluminescent device can be also utilized as a multi-color or full-color display device, for example.

In recent years, fabricated as an organic electroluminescent apparatus such as an organic electroluminescent panel has been one having a plurality of organic electroluminescent devices, described above, arranged thereon in a separated state.

Conventionally in fabricating the organic electroluminescent apparatus having the plurality of organic electroluminescent devices arranged thereon in a separated state, a hole injection electrode has been generally formed in a predetermined pattern on a transparent substrate such as a glass substrate and separated, and an organic layer and an electron injection electrode which are formed on the hole injection electrode have been also respectively formed in predetermined patterns and separated.

Although an operation for forming the hole injection electrode formed in a predetermined pattern on the transparent substrate and separating it, as described above, particularly presents no problem, an operation for respectively forming the organic layer and the electron injection electrode in predetermined patterns on the hole injection electrode and separating them presents a problem.

Specifically, the organic layer used for the organic electroluminescent device is generally low in heat resistance, solvent resistance, and humidity resistance. When the organic layer and the electron injection electrode formed on the organic layer are formed in predetermined patterns by photolithography or the like, there are some problems. For example, a solvent in photoresist enters the organic layer, the organic layer is dissolved in an etchant, and an organic layer is damaged by plasma at the time of dry etching.

Therefore, the organic layer and the electron injection electrode have been heretofore generally formed in predetermined patterns by evaporation using a mask member. When they are thus evaporated using the mask member, however, fine processing cannot be performed.

In recent years, an organic electroluminescent apparatus so adapted that a hole injection electrode is formed in a suitable pattern on a transparent substrate, a barrier having electrical insulating properties with a suitable pattern is provided on the transparent substrate, an organic layer and an electron injection electrode are successively laminated by evaporation from above the barrier, and the organic layer and the electron injection electrode are respectively separated by the barrier has been proposed, as disclosed in JP-A-8-227276, JP-A-8-315981, JP-A-9-102393, etc.

In JP-A-8-315981 and JP-A-9-102393, in providing a patterned barrier 3 on a hole injection electrode 2 formed on a transparent substrate 1, an upper surface 3a of the barrier 3 is increased in size to provide an overhang portion, as shown in FIG. 1.

When an organic layer 4 is evaporated from above the barrier 3 having the overhang portion thus provided by increasing the size of the upper surface 3a, the organic layer 4 is not formed under the overhang portion, so that an exposed part of the hole injection electrode 2 remains under the overhang portion. When the electron injection electrode 5 is then evaporated, the electron injection electrode 5 may be short-circuited upon being formed on not only the organic layer 4 but also the exposed part of the hole injection electrode 2.

In recent years, an organic layer having luminescent properties using a macromolecular material that is high in heat stability and is superior in durability has been paid attention to.

The organic layer containing the macromolecular material can be generally formed simply by dipping or spin coating. When the patterned barrier 3 is provided on the hole injection electrode 2 formed on the transparent substrate 1 as described above, however, the barrier 3 interferes with the formation. Therefore, it is difficult to form the organic layer 4 using the macromolecular material by the above-mentioned method.

In the case of the above-mentioned organic layer containing the macromolecular material, erosion by an etchant or the like is restrained. Consequently, it is considered that an electron injection electrode is provided on the organic layer containing the macromolecular material, and the electron injection electrode is formed in a predetermined pattern by photolithography or the like.

When the electron injection electrode is formed in a predetermined pattern by photolithography or the like, however, it is difficult to control etching because the thickness of the electron injection electrode is generally small. Therefore, the etchant penetrates into a portion between the organic layer containing the macromolecular material and the electron injection electrode, so that some problems occur. For example, contact characteristics between the organic layer and the electron injection electrode are degraded. When an electrode material having a small work function such as magnesium is used as a material composing the electron injection electrode such that electrons are efficiently injected into the organic layer from the electron injection electrode, some problems occur. For example, the electron injection electrode is degraded upon being oxidized by water or the like of the etchant, so that light cannot be stably emitted.

SUMMARY OF THE INVENTION

An object of the present invention is to make it possible to arrange, in an organic electroluminescent apparatus in which a plurality of organic electroluminescent devices each having an organic layer having luminescent properties provided between a hole injection electrode and an electron injection electrode are arranged with they being separated from one another, the electroluminescent devices in a separated state simply and suitably.

Another object of the present invention is to make it possible to simply form, when an organic layer having luminescent properties contains a macromolecular material, the organic layer containing the macromolecular material using dipping or spin coating as well as make it possible to arrange organic electroluminescent devices in a separated state simply and suitably.

In an organic electroluminescent apparatus according to the present invention, in arranging a plurality of organic electroluminescent devices each having an organic layer having luminescent properties provided between a first electrode and a second electrode in a separated state, a barrier having electrical insulating properties is formed in a predetermined pattern on the organic layer, to separate the organic electroluminescent devices from each other by the barrier.

An example of such an organic electroluminescent apparatus is one comprising a first electrode formed in a predetermined pattern on a substrate, an organic layer having luminescent properties provided on the first electrode, a barrier having electrical insulating properties formed in a predetermined pattern on the organic layer, and a second electrode formed on the organic layer upon being separated by the barrier having electrical insulating properties.

A method of fabricating an organic electroluminescent apparatus according to the present invention comprises the steps of providing a first electrode in a predetermined pattern on a substrate, providing an organic layer having luminescent properties on the first electrode, providing a barrier having electrical insulating properties with a predetermined pattern on the organic layer, and providing a second electrode separated by the barrier having electrical insulating properties on the organic layer.

In the method of fabricating the organic electroluminescent apparatus according to the present invention, the first electrode with a predetermined pattern is formed on the substrate, the organic layer having luminescent properties is provided on the substrate having the first electrode formed thereon, the barrier having electrical insulating properties with a predetermined pattern is provided on the organic layer, and the electron injection electrode is provided from above the barrier having electrical insulating properties. Consequently, the electron injection electrode is separated by the barrier, so that the organic electroluminescent devices are arranged in a separated state.

In the present invention, the barrier having electrical insulating properties is provided on the organic layer. Even when the upper surface of the barrier is increased in size to provide an overhang portion, the first electrode is not exposed under the overhang portion. When the second electrode is formed, the second electrode and the first electrode are not short-circuited upon being brought into contact with each other.

In the present invention, the organic layer is formed, and the barrier is then provided on the organic layer. When the organic layer is formed by painting the substrate having the first electrode formed thereon with a macromolecular material solution by the method of dipping or spin coating, therefore, the barrier does not interfere with the formation.

Examples of the macromolecular material used for the organic layer include macromolecular materials having fluorescent properties such as a poly(p-phenylene vinylene) derivative, polythiophene, and polyvinyl carbazole, and macromolecular materials having electrical insulating properties, in which a pigment is doped, such as polymethyl methacrylate and polycarbonate.

In providing the barrier having electrically insulating properties on the organic layer, when a macromolecular material solution for barrier formation is applied, the applied macromolecular material solution for barrier formation is solidified, and the barrier having electrically insulating properties with a predetermined pattern is then formed by etching, used as the macromolecular material in the organic layer is one which is insoluble in the macromolecular material solution for barrier formation or an etchant.

Furthermore, in the present invention, when the barrier having electrical insulation properties with a predetermined pattern is provided on the organic layer, and an electrode material is evaporated from above the barrier having electrical insulating properties, to provide a second electrode on the organic layer separated by the barrier having electrical insulating properties, the second electrode formed on the organic layer need not be formed in a predetermined pattern upon being processed by an etchant. Therefore, the possibilities that the etchant penetrates into a portion between the organic layer and the second electrode as in the conventional example, so that contact properties between the organic layer and the second electrode are degraded, and the second electrode is degraded upon being oxidized are eliminated, so that light can be stably emitted in each of the organic electroluminescent devices.

There and other objects, advantages and features of the invention will become apparent from the following description thereof taken in conjunction with the accompanying drawings which illustrate specific embodiment of the invention.

DESCRIPTION OF THE PREFERRED EMBODIMENTS

An organic electroluminescent apparatus according to an embodiment of the present invention and a method of fabricating the same will be specifically described on the basis of the accompanying drawings.

Embodiment 1

Figure 1:
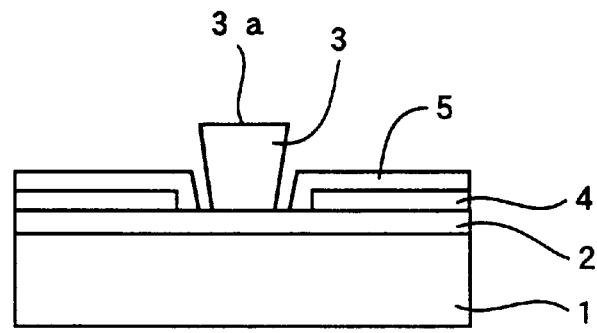
FIG. 1 is a partial explanatory view of a conventional organic electroluminescent device.
Figure 2:
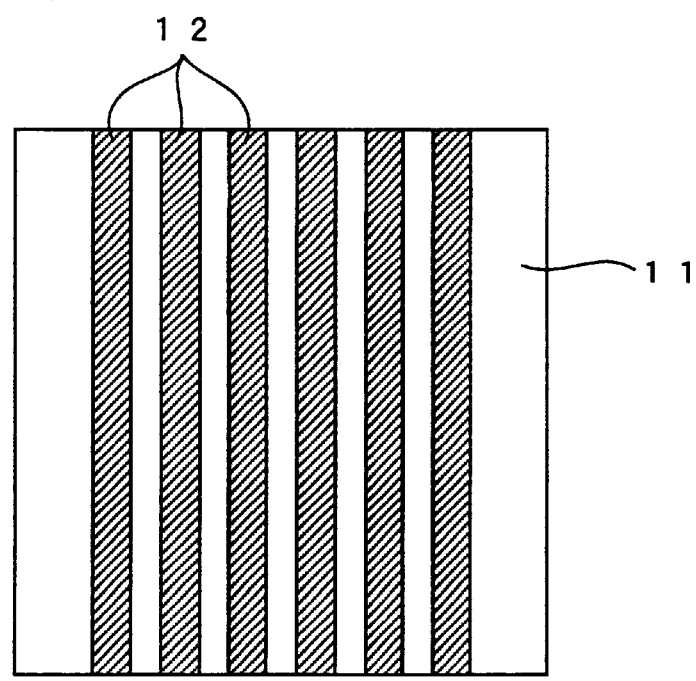
FIG. 2 is a plan view showing a state where a plurality of columns of hole injection electrodes are provided with required spacing on a transparent substrate in an embodiment 1 of the present invention.
Figure 3:
FIG. 3 is a schematic explanatory view showing the steps of fabricating the organic electroluminescent apparatus in the embodiment 1.
Figure 3:
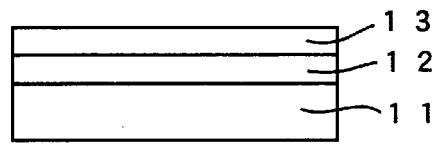
Figure 3:
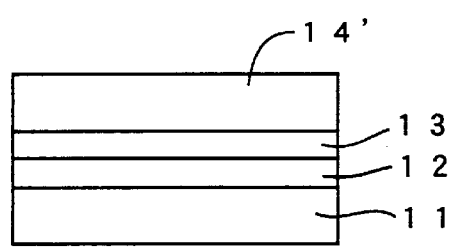
Figure 3:
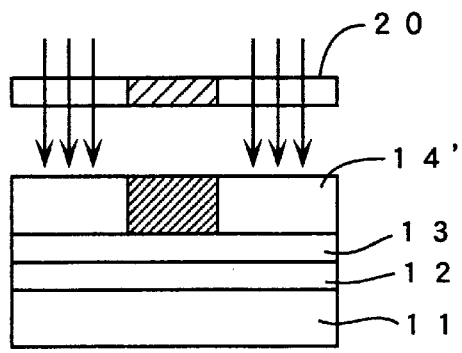
Figure 3:
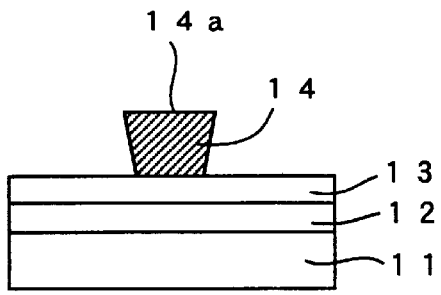
Figure 3:
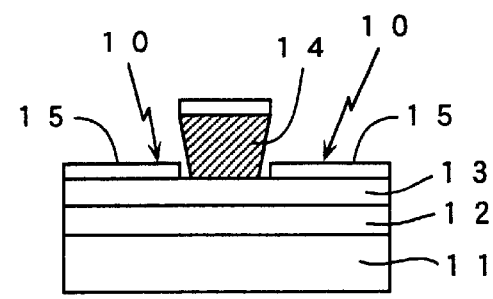
Figure 4:
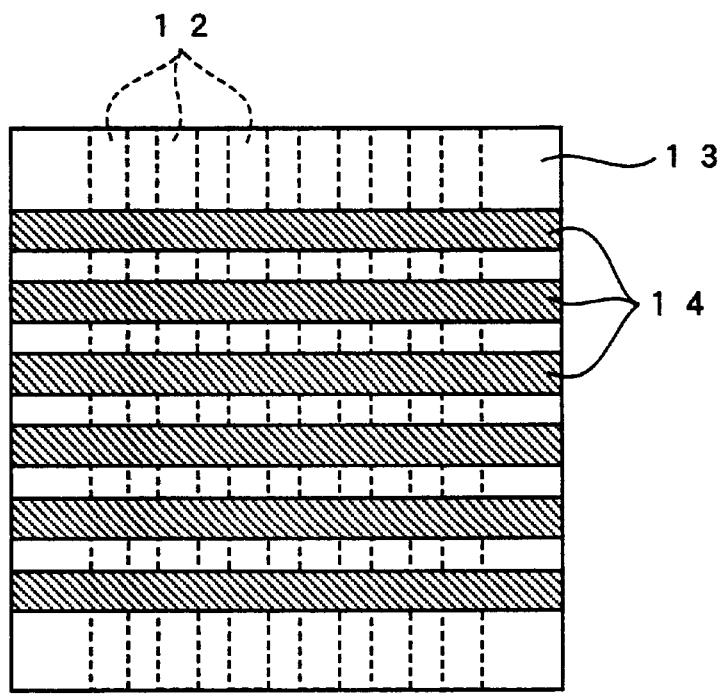
FIG. 4 is a plan view showing a state where a plurality of rows of barriers each having an overhang portion are provided on an organic layer so as to be perpendicular to hole injection electrodes in the embodiment 1.

In the present embodiment 1, a plurality of columns of transparent hole injection electrodes 12 each composed of an indium-tin oxide (ITO) were provided with required spacing using a normal resist process on a transparent substrate 11 composed of glass, as shown in FIGS. 2 and 3 (A).

A hole transporting material composed of N,N'-diphenyl-N'N-bis(3-methylphenyl)-1,1-biphenyl-4,4'-diamine (TPD) indicated by the following chemical formula 1, a luminescent material composed of a bis(10-hydroxybenzo[h]quinolinate)beryllium complex (BeBq$_2$) indicated by the following chemical formula 2, and polymethyl methacrylate indicated by the following chemical formula 3 were dissolved in dichloromethane. A solution thus obtained was applied onto the transparent substrate 11 having the plurality of columns of hole injection electrodes 12 formed thereon as described above using spin coating, and was then solidified upon being heated at a temperature of 120° C., to form an organic layer 13 using a macromolecular material on the transparent substrate 11 having the hole injection electrodes 12 formed thereon.

[Chemical formula 1]

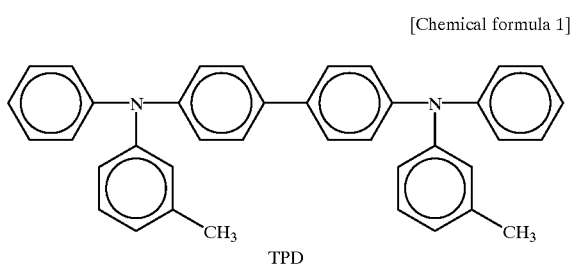

TPD

[Chemical formula 2]

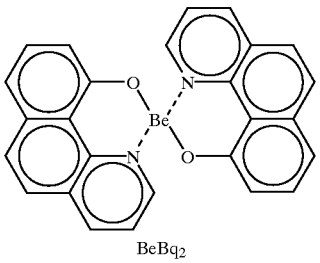

BeBq$_2$

[Chemical formula 3]

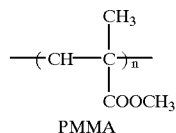

PMMA

Positive resist 14' (Tokyo Ohka Kogyo K. K.: OFPR-1000) was applied so as to have a thickness of 1.5 μm, as shown in FIG. 3 (C), to the organic layer 13 containing a macromolecular material as described above, was heat-treated, and was then exposed in a predetermined pattern using a photomask 20, as shown in FIG. 3 (D), in accordance with normal photolithography in the positive resist 14'. Thereafter, etching was made in such a manner that a part, which has not been exposed, of the positive resist 14' would remain, to provide a plurality of rows of barriers 14 each having an overhang portion provided by increasing the size of its upper surface 14a on the organic layer 13 so as to be perpendicular to the hole injection electrodes 12, as shown in FIGS. 3 (E) and 4.

An electron injection electrode 15 composed of an Al—Li alloy was formed by vacuum evaporation, as shown in FIG. 3 (F), on the organic layer 13 having the plurality of rows of barriers 14 thus provided thereon, and the electron injection electrode 15 was separated by the barriers 14, to obtain an organic electroluminescent apparatus having s plurality of organic electroluminescent devices 10 arranged thereon in a matrix.

In the organic electroluminescent apparatus according to the embodiment 1, consider a case where a voltage is applied between the hole injection electrodes 12 and the electron injection electrodes 15. In this case, when the voltage was 17 volts, green light having luminance of 1000 cd/cm$^2$ could be emitted from each of the organic electroluminescent devices 10. Further, the organic electroluminescent devices 10 were suitably separated from each other, so that no short also occurred.

Embodiment 2

In the present embodiment 2, a plurality of columns of transparent hole injection electrodes 12 each composed of ITO were provided with required spacing on a transparent substrate 11 composed of glass, after which poly(p-phenylene vinylene) (PPV) was formed as an organic layer 13 using a macromolecular material. The organic layer 13 composed of PPV was formed in accordance with a method described in a document [J. H. Burroughes, et al, Nature, Vol. 347, pp.539–541 (1990)].

After the organic layer 13 composed of PPV was thus formed, a plurality of rows of barriers 14 each having an overhang portion by increasing the size of its upper surface 14a were provided on the organic layer 13 so as to be perpendicular to the hole injection electrodes 12, an electron injection electrode 15 composed of an Al—Li alloy was formed on the organic layer 13 having the barriers 14 thus provided thereon by vacuum evaporation, and the electron injection electrode 15 was separated by the barriers 14, to obtain an organic electroluminescent apparatus having a plurality of organic electroluminescent devices 10 arranged thereon in a matrix. The organic layer 13 composed of PPV was not dissolved in a solution of the above-mentioned positive resist 14' (produced by Tokyo Ohka Kogyo K. K.: OFPR - 1000) or an etchant.

In the organic electroluminescent apparatus according to the embodiment 2, consider a case where a voltage is applied between the hole injection electrodes 12 and the electron injection electrodes 15. In this case, when the voltage was 15 volts, yellow green light having luminance of 100 cd/m$^2$ could be emitted from each of the organic electroluminescent devices 10. Further, the organic electroluminescent devices 10 were suitably separated from each other, so that no short also occurred.

Embodiment 3

In the present embodiment 3, an organic electroluminescent apparatus was fabricated in the same manner as the organic electroluminescent apparatus according to the above-mentioned embodiment 1 except that in providing an organic layer 13, polycarbonate was used in place of the above-mentioned polymethyl methacrylate.

In the organic electroluminescent apparatus according to the embodiment 3, consider a case where a voltage is applied between hole injection electrodes 12 and electron injection electrodes 15. In this case, when the voltage was 15 volts, green light having luminance of 1200 cd/m$^2$ could be emitted from each of organic electroluminescent devices 10. Further, the organic electroluminescent devices 10 were suitably separated from each other, so that no short also occurred.

Embodiment 4

Figure 5:
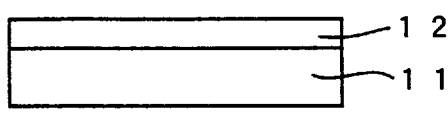
FIG. 5 is a schematic explanatory view showing the steps of fabricating an organic electroluminescent apparatus in an embodiment 4 of the present invention.
Figure 5:
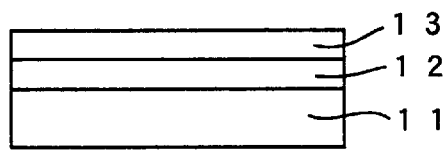
Figure 5:
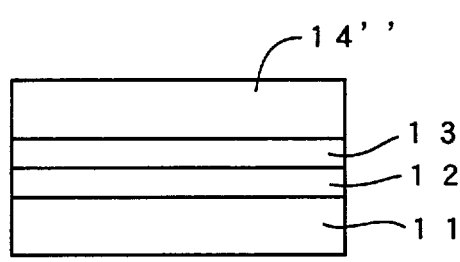
Figure 5:
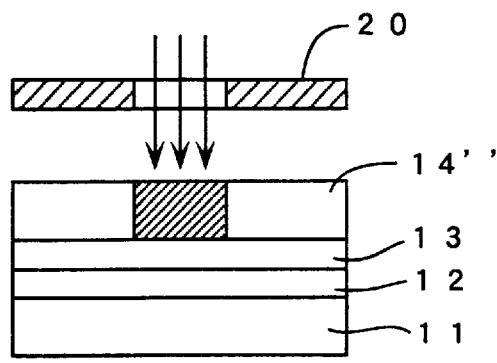
Figure 5:
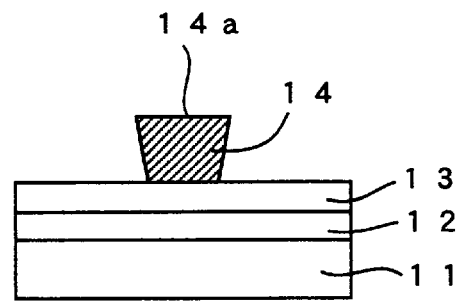
Figure 5:
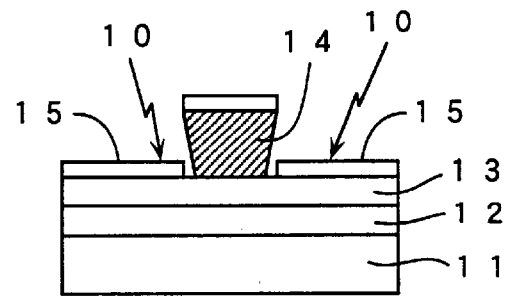

Also in the present embodiment 4, a plurality of columns of transparent hole injection electrodes 12 each composed of ITO were provided with required spacing on a transparent substrate 11 composed of glass in the same manner as that in the above-mentioned embodiment 1, and an organic layer 13 containing the same macromolecular material as that in the embodiment 1 was provided thereon, as shown in FIGS. 5(A) and 5(B).

In the embodiment 4, in providing a plurality of rows of barriers 14 on the organic layer 13 so as to be perpendicular to the hole injection electrodes 12, negative resist 14" produced by Nippon Zeon K. K. was used in place of the above-mentioned positive resist 14' (produced by Tokyo Ohka Kogyo K. K.: OFPR - 1000), as shown in FIG. 5(C). The negative resist 14" was exposed in a predetermined pattern using a photomask 20, as shown in FIG. 5(D), in accordance with normal photolithography in the negative resist 14". Thereafter, etching was then made in such a manner that a part, which has not been exposed, of the negative resist 14" would remain, to provide a plurality of rows of barriers 14 each having an overhang portion on its upper surface 14a so as to be perpendicular to the hole injection electrodes 12. Thereafter, the same steps as those in the embodiment 1 were carried out, to fabricate an organic electroluminescent apparatus.

When the barriers 14 were provided using the negative resist 14" as in the embodiment 4, it was possible to set the height of the barriers 14 to 5 $\mu$m. The electron injection electrodes 15 could be more reliably separated from each other by the barriers 14, so that the organic electroluminescent devices 10 could be reliably separated from each other. Therefore, the yield of the electroluminescent apparatus is improved by approximately 30%.

Although in each of the above-mentioned embodiments, the transparent hole injection electrodes composed of ITO are provided on the transparent substrate, the transparent hole injection electrodes composed of ITO can be also provided on the organic layer after being separated from each other by barriers.

Although the present invention has been fully described by way of examples, it is to be noted that various changes and modification will be apparent to those skilled in the art.

Therefore, unless otherwise such changes and modifications depart from the scope of the present invention, they should be construed as being included therein.

What is claimed is:

1. An organic electroluminescent apparatus constructed by arranging a plurality of organic electroluminescent devices each having an organic layer having luminescent properties provided between a first electrode and a second electrode in a separated state,
    a barrier having electrically insulating properties being formed in a predetermined pattern on said organic layer, to separate the organic electroluminescent devices from each other by the barrier.

2. The organic electroluminescent apparatus according to claim 1, wherein
    said first electrode is formed in a predetermined pattern on a substrate,
    said organic layer having luminescent properties is provided on the first electrode,
    said barrier having electrical insulating properties is formed in a predetermined pattern on the organic layer, and
    said second electrode is formed on the organic layer upon being separated by the barrier having electrical insulating properties.

3. The organic electroluminescent apparatus according to claim 1, wherein
    the organic layer having luminescent properties contains a macromolecular material.

4. The organic electroluminescent apparatus according to claim 1, wherein
    said organic layer has solvent resistance.

5. The organic electroluminescent apparatus according to claim 2, wherein
    the first electrode formed in a predetermined pattern and the barrier having electrical insulating properties formed in a predetermined pattern cross each other.

* * * * *